(12) United States Patent
Rao et al.

(10) Patent No.: US 9,081,060 B2
(45) Date of Patent: Jul. 14, 2015

(54) BUFFER TESTING FOR RECONFIGURABLE INSTRUCTION CELL ARRAYS

(71) Applicant: QUALCOMM Incorporated, San Diego, CA (US)

(72) Inventors: Hari Rao, San Diego, CA (US); Venkatasubramanian Narayanan, San Diego, CA (US); Venugopal Boynapalli, San Marcos, CA (US); Sagar Suresh Sabade, San Diego, CA (US); Bilal Zafar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 27 days.

(21) Appl. No.: 14/046,084

(22) Filed: Oct. 4, 2013

(65) Prior Publication Data

US 2015/0100842 A1    Apr. 9, 2015

(51) Int. Cl.
*G01R 31/3177*  (2006.01)
*G01R 31/3185*  (2006.01)
*G06F 11/27*  (2006.01)
*G01R 31/3187*  (2006.01)

(52) U.S. Cl.
CPC ........ *G01R 31/3177* (2013.01); *G01R 31/3185* (2013.01); *G06F 11/27* (2013.01); *G01R 31/3187* (2013.01); *G01R 31/318533* (2013.01); *G01R 31/318536* (2013.01)

(58) Field of Classification Search
CPC ................. G11C 29/48; G11C 29/16; G11C 2029/0401; G01R 31/318533; G01R 31/318516; G01R 31/318519; G01R 31/318544; G01R 31/3187; G01R 31/3177; G01R 31/318536

USPC .......................... 714/718, 724, 725, 733, 726
See application file for complete search history.

(56) References Cited

U.S. PATENT DOCUMENTS

| 6,067,262 | A  | * | 5/2000  | Irrinki et al. ................... 365/201 |
| 6,367,042 | B1 | * | 4/2002  | Phan et al. ..................... 714/733 |
| 6,560,740 | B1 | * | 5/2003  | Zuraski et al. ................. 714/733 |
| 6,769,081 | B1 | * | 7/2004  | Parulkar ......................... 714/733 |
| 6,874,110 | B1 | * | 3/2005  | Camarota ....................... 714/733 |
| 7,111,190 | B2 | * | 9/2006  | Venkatraman et al. ......... 714/6.1 |
| 7,275,196 | B2 | * | 9/2007  | Reblewski ...................... 714/733 |
| 7,293,199 | B1 | * | 11/2007 | Zarrineh et al. ................ 714/30 |
| 7,475,315 | B1 |   | 1/2009  | Natarajan et al. |
| 7,502,977 | B2 | * | 3/2009  | Venkatraman et al. ....... 714/718 |

(Continued)

FOREIGN PATENT DOCUMENTS

WO    WO-0186313 A1    11/2001
WO    WO-2012031362 A1    3/2012

OTHER PUBLICATIONS

International Search Report and Written Opinion—PCT/US2014/057680—ISA/EPO—Jan. 26, 2015.

*Primary Examiner* — James C Kerveros
(74) *Attorney, Agent, or Firm* — Haynes and Boone, LLP (57) ABSTRACT

A reconfigurable instruction cell array (RICA) is provided that includes a plurality of master switch boxes that are configured to read and write from a plurality of buffers through a cross-bar switch. A master built-in-self-test (MBIST) engine is configured to drive a test word into the write path of at least one master switch box and to control the cross-bar switch so that the driven test word is broadcast to all the buffers for storage. The MBIST engine is also configured to retrieve the stored test words from the buffers through a read bus within the cross-bar switch.

16 Claims, 5 Drawing Sheets

(56) References Cited

U.S. PATENT DOCUMENTS

| | | |
|---|---|---|
| 7,549,098 B2 | 6/2009 | Barth et al. |
| 7,958,414 B1 * | 6/2011 | Ansari et al. ............... 714/718 |
| 7,962,821 B2 | 6/2011 | Tokunaga et al. |
| 7,979,758 B2 | 7/2011 | Hur et al. |
| 8,042,011 B2 | 10/2011 | Nicolaidis et al. |
| 8,099,638 B2 * | 1/2012 | Ahmad et al. ............... 714/718 |
| 8,565,033 B1 * | 10/2013 | Manohararajah et al. ..... 365/193 |
| 2012/0319717 A1 | 12/2012 | Chi |
| 2013/0285739 A1 * | 10/2013 | Blaquiere et al. ............ 327/565 |

* cited by examiner

BUFFER TESTING FOR RECONFIGURABLE INSTRUCTION CELL ARRAYS

TECHNICAL FIELD

This application relates to reconfigurable computing, and more particularly to the testing of buffers for a reconfigurable instruction cell array.

BACKGROUND

Although processor speeds have been progressively increased, the need for increased computing power remains unabated. For example, smart phones now burden their processors with a bewildering variety of tasks. But a single-core processor can only accommodate so many instructions at a given time. Thus, it is now common to design systems with multi-core or multi-threaded processors that can process sets of instructions in parallel. But the resulting instruction-based architectures must always battle the limits imposed by die space, power consumption, and complexity with regard to increasing the instruction processing speed.

As compared to the use of a programmable processing core, there are many algorithms that can be more efficiently processed in dedicated hardware. For example, image processing involves substantial parallelism and processing of pixels in groups through a pipeline of processing steps. If the algorithm is then mapped to hardware, the implementation takes advantages of this symmetry and parallelism such that the processing speed is increased over processor-based architectures. But designing dedicated hardware is expensive and also cumbersome in that if the algorithm is modified, the dedicated hardware must be redesigned.

Figure 1A:
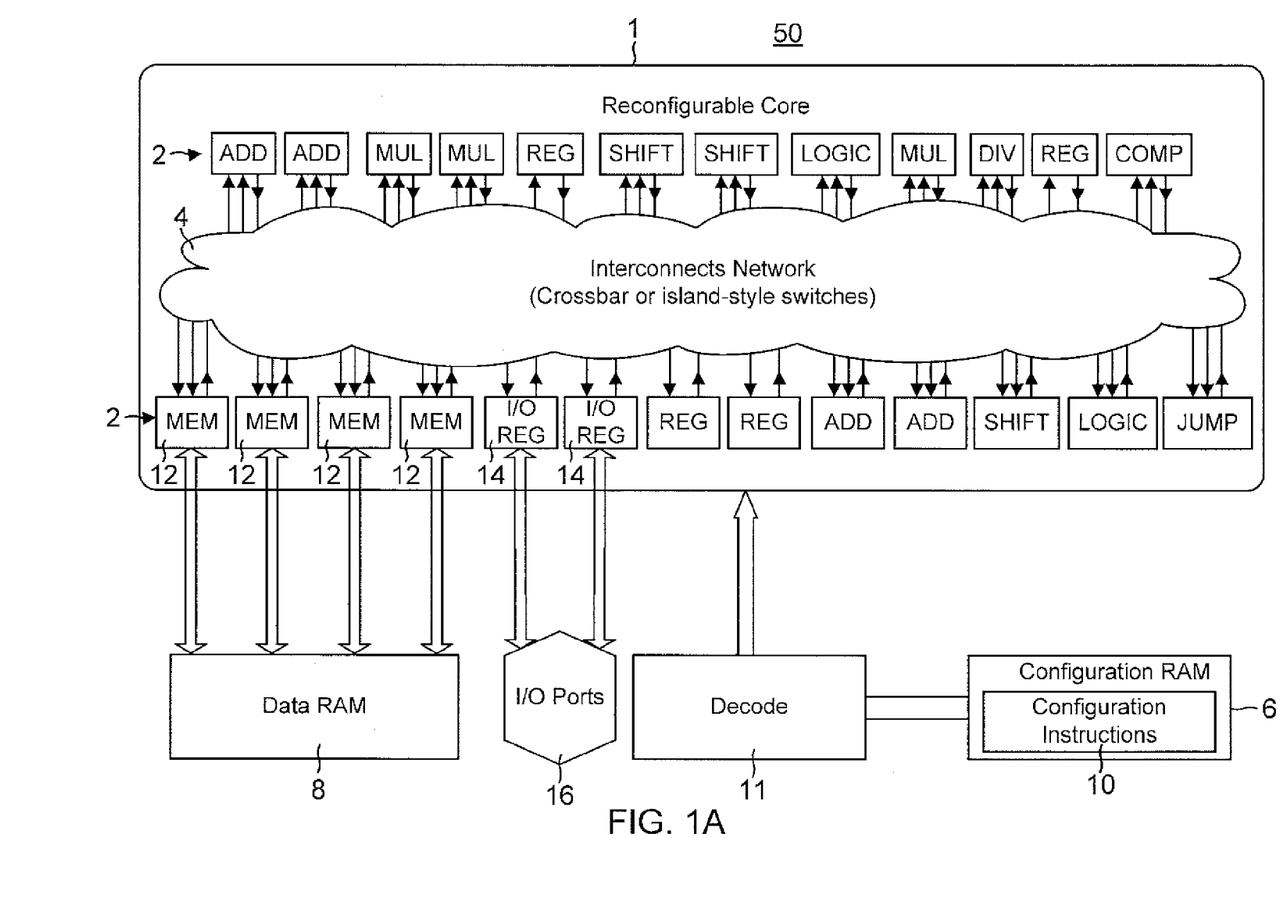
FIG. 1A is a block diagram for an example reconfigurable instruction cell array (RICA).

To provide an efficient compromise between instruction-based architectures and dedicated hardware approaches, a reconfigurable instruction cell array (RICA) architecture has been developed. FIG. 1A illustrates an example RICA system 50 having a reconfigurable core 1. In reconfigurable core 1, a plurality of instruction cells 2 such as adders (ADD), multipliers (MUL), registers (REG), logic operation shifters (SHIFT), dividers (DIV), data comparators (COMP), logic gates (LOGIC), and logic jump cells (JUMP) are interconnected through a programmable switch fabric 4. The configuration of instruction cells 2 with regard to their logical function or instruction they implement can be reprogrammed as necessary to implement a given algorithm or function. Switch fabric 4 would be reprogrammed accordingly as well. The plurality of instruction cells 2 include memory interface cells 12 that interface data for remaining ones of the instructions cells 2 as retrieved or loaded into a data memory 8. The resulting processing by instruction cells 2 occurs according to configuration instructions 10 obtained from a configuration RAM 6. A decode module 11 decodes instructions 10 to not only get the configuration data for instructions cells 2 but also for switching fabric 4. RICA 50 interfaces with external systems through I/O ports 16 and specialized instructions cell registers 14.

Figure 1B:
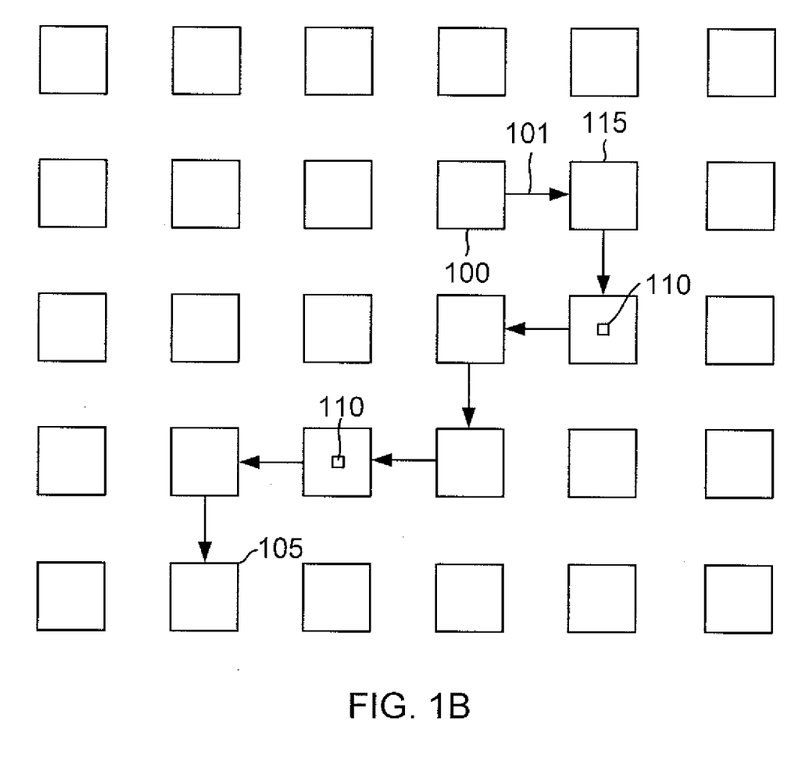
FIG. 1B is a block diagram for an array of switch boxes in the RICA of FIG. 1A.

The instruction cells in a reconfigurable array may be arranged by rows and columns. An instruction cell, any associated register, and an associated input and output switching fabric for the instruction cell are denoted herein as a switch box. FIG. 1B illustrates an array of switch boxes arranged in rows and columns. A datapath formed between selected switch boxes is carried on channels selected from a plurality of channels. The channel routing is also arranged in rows and columns matching the rows and columns for the switch boxes. Each channel has a certain width in bits. The row directions may be considered to run east and west whereas the column directions run north and south. A datapath beginning in an instruction cell in an initial switchbox 100 routes on an output channel 101 in an east row direction. The routing for the datapath from subsequent switch boxes is in the appropriate east/west row direction or north/south column direction such that a final switch box 105 at some selected row and column position is reached. In this example data path, two instruction cells are configured as arithmetic logic units (ALUs) 110. The instruction cells for the remaining switch boxes are not shown for illustration clarity. Each switch box includes two switch matrices or fabrics: an input switch fabric to select for channel inputs to its instruction cell and also an output switch fabric to select for the channel outputs from the switch box. Referring back to FIG. 1A, switch fabric 4 represents the collection of each switch box's individual input and output switch fabrics.

The configuration of a switch box's instruction cell and switch fabrics occurs according to a configuration word received from configuration RAM 6. In this fashion, a RICA may be configured as necessary to perform a desired logical function or algorithm. For example, a RICA may be configured to perform an algorithm such as image processing that involves processing multiple pixels through a pipelined processing scheme. The desired algorithm can be mapped to instruction cells in a manner that emulates a dedicated hardware approach. But there is no need to design dedicated hardware, instead one can merely program the instruction cells and switching fabric as necessary. Thus, if an algorithm must be redesigned, a user may merely change the programming as necessary instead of having to redesign hardware. This is quite advantageous over traditional instruction-based computing approaches.

In contrast to an instruction cell, the logic block in a field programmable gate array (FPGA) uses lookup tables (LUTs). For example, suppose one needs an AND gate in the logic operations carried out in a configured FPGA. A corresponding LUT would be programmed with the truth table for the AND gate logical function. But an instruction cell is much "coarser-grained" in that it contains dedicated logic gates. In that regard, an ALU instruction cell includes assorted dedicated logic gates. It is the function of the ALU instruction cell that is configurable—its primitive logic gates are dedicated gates and thus are non-configurable. For example, a conventional CMOS inverter is one type of dedicated logic gate. There is nothing configurable about such an inverter, it needs no configuration bits. But the instantiation of an inverter function in a FPGA programmable logic block is instead performed by a corresponding programming of a LUT's truth table. Thus, as used herein, the term "instruction cell" refers to a configurable logic element that comprises dedicated logic gates.

Although a RICA offers robust advantages as compared to FPGA or dedicated processor architectures, challenges remain in its implementation. For example, it is conventional to arrange an array of switch boxes by rows and columns. The switching fabric in each switch box must then accommodate a data path that might begin at some row and column location and then end at some other row and column location. In this data path, an instruction cell such as an ALU performs its logical functions on one or more operands. An operand in this context is a received channel input. Depending upon its configuration bits, an ALU instruction cell is configured to perform corresponding logical operations. For example, a first switch box may include an ALU instruction cell configured to add two operands corresponding to two channel inputs. But the same ALU instruction cell may later be updated to subtract the two operands. The results from the logical operation within the instruction cell may be required in another instruction cell. Thus, the output switch fabric in the first switch box may be configured to drive the resulting data out of the first switch box through corresponding channel outputs. In contrast, an FPGA's LUTs produce a bit, they do not generate words. So the switch fabric in an FPGA is fundamentally different from the switch fabrics in a RICA in that an FPGA's switch fabric is configured to route the bits from the FPGA's LUTs. In contrast, the routing between switch boxes in a RICA is configured to route words as both input channels and output channels. For example, a switch box array may be configured to route 20 channels. Switch boxes in such an embodiment may thus receive 20 input channels from all four directions (east and west in the row directions, and north and south in the column directions) and drive 20 output channels in these four directions.

As a RICA performs a desired logical function or algorithm, it is often the case that buffers are necessary to store intermediate results. It would be challenging with regard to routing to enable every switch box to have the ability to directly read and write from one of buffers. To alleviate the routing demands, a subset of switch boxes are configured as master switch boxes that have this direct read and write access. This is not a severe limitation on the remaining non-master switch boxes since if these remaining switch boxes need to read or write data, the read input or write output is readily routed through the switch fabrics in a RICA to or from its master switch boxes. For example, suppose that switch box 105 of FIG. 1B is a master switch box and that switch box 100 is a non-master. Switch box 100 may then write to a buffer (part of data RAM 8 in FIG. 1A) through master switch box 105 using the routing through the intervening switch boxes as shown. Referring again to RICA 50 of FIG. 1A, memory interface cells 12 represent such master switch boxes whereas data RAM 8 represents an array of buffers.

It is desirable for each master switch box 12 to be able to write a data word to any of buffers 8 or read a word from any of buffers 8. To enable these interconnections, one solution would be to use place and route techniques (full synthesis). But the routing becomes very congested in such a case. Another critical issue is the testing of the buffers. A design-for-test (DFT) RICA implemented with full synthesis becomes unworkable. Moreover, even if the routing is enabled, the resulting testing is very slow.

Accordingly, there is a need in the for improved DFT features for RICA buffer testing.

SUMMARY

A RICA includes a plurality of master switch boxes that are configured to read from and write to a plurality of buffers through a cross-bar switch. A master built-in-self-test (MBIST) engine is configured to drive a test word into a write path of at least one master switch box and to control the cross-bar switch so that the driven test word is broadcast to all the buffers for storage. The MBIST engine is also configured to retrieve the stored test words from the buffers through a read bus within the cross-bar switch.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

To provide improved DFT features for RICA buffer testing, a RICA is disclosed in which a cross-bar switch is used to interconnect the buffers with the master switch boxes. The remaining non-master switch boxes in the RICA read and write to the buffers through the master switch boxes as discussed earlier. A memory built-in-self-test (MBIST) engine advantageously exploits the cross-bar switch to broadcast a test word to the buffers. In addition, the MBIST engine retrieves the resulting stored test word from each buffer through the cross-bar switch. In this fashion, the disclosed RICA architecture enables rapid testing of buffers while minimizing complexity and die space demands. These advantageous features may be better understood with regard to the following example embodiments.

Example Embodiments

Figure 2:
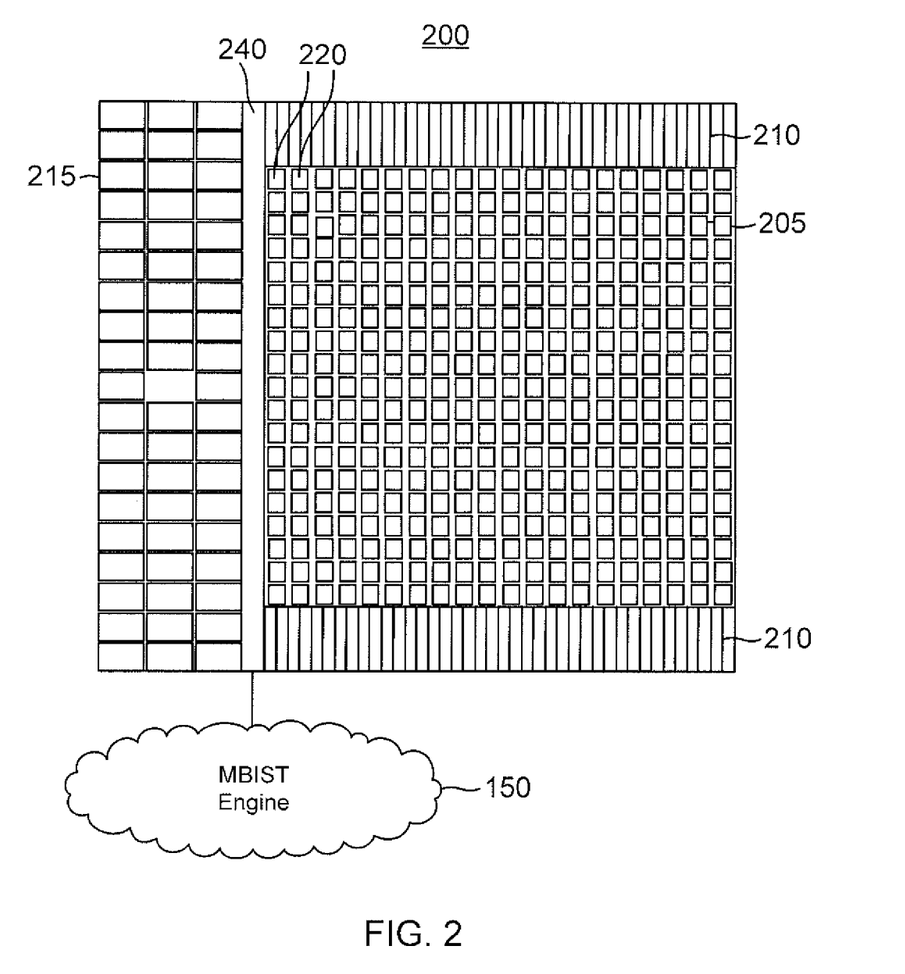
FIG. 2 is a block diagram for a RICA configured with a cross-bar switch and memory built-in-self-test (MBIST) engine in accordance with an embodiment of the disclosure.

Referring now to FIG. 2, RICA 200 is an example of the improved DFT features disclosed herein. RICA 200 includes an array of switch boxes 205 arranged into, in one embodiment, twenty rows and twenty columns. The switch boxes in the first two columns of the array comprise master switch boxes 220 that are configured for direct read and write access to an array of buffers 215. In this embodiment, RICA 200 includes fifty-six buffers 215. To match an array footprint height for the switch box array and corresponding configuration memories 210, buffers 215 are arranged into nineteen rows and three columns into a buffer footprint adjacent the array footprint. In that regards, the various elements shown in RICA 200 are all represented by their footprint on an underlying semiconductor substrate. Since 19 rows times 3 columns leads to one more than the desired number of fifty-six buffers, a middle column of buffers 215 includes only eighteen buffers 215 instead of nineteen as in the remaining buffer columns.

To alleviate the routing congestion suffered by fully synthesized designs, master switch boxes 220 both read from and write to buffers 215 through a cross-bar switch 240. Cross-bar switch 240 includes a plurality of wires or leads for carrying the read and write signals. The number of wires depends upon the number of master switch boxes 220 as well as the number of buffers 215 and their width. For example, since RICA 200 includes fifty-six buffers 215 each having a word width of 32 bits, cross-bar switch 240 includes 32×56=1,792 read wires for carrying a word from each of the fifty-six buffers 215. In RICA 200, these read wires or leads are arranged in a read bus (discussed further below) in a column between master switch boxes 220 and buffers 215. With regard to a layout, the 1,792 wires for the read bus may be arranged in a metal layer (or layers) above a columnar-shaped cross-bar switch footprint on a semiconductor substrate for RICA 200 between the switch box array footprint and the buffer array footprint.

The write operation may be accommodated analogously such that each master switch box 220 may write a 32-bit word to any of the fifty-six buffers 215. To accommodate these signals, cross-bar switch 240 in one embodiment includes 32×40=1,280 write wires that may be arranged in a write bus in the column direction in a metal layer (or layers) over the columnar footprint occupied by cross-bar switch 240.

Figure 3:
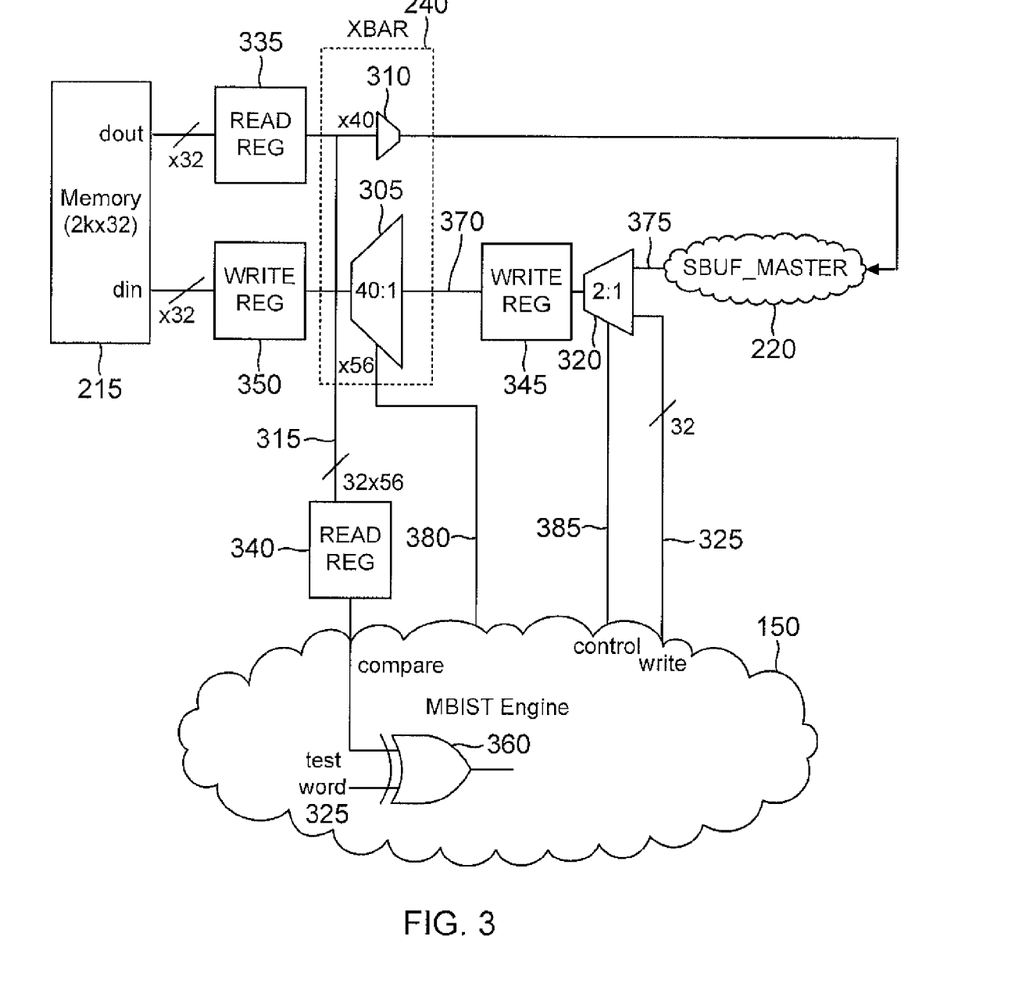
FIG. 3 is a block diagram showing additional details for the cross-bar switch and MBIST engine of FIG. 2.

Cross-bar switch 240 may be better understood with regard to FIG. 3. Each master switch box 220 couples through a corresponding read multiplexer 310 to a read bus 315. As discussed above, the number of read wires in read bus 315 depends upon the number of buffers 215 as well as their word width. For illustration clarity, only a single buffer 215, a single read multiplexer 310, and a single master switch box 220 are shown in FIG. 3. A RICA embodiment having forty master switch boxes 220 may thus include forty 56:1 read multiplexers 310 to accommodate the buffer read operation for each of the master switch boxes.

The write operation is analogous in that cross-bar switch 240 includes a write multiplexer 305 for each buffer 215. In an embodiment having fifty-six buffers 215, cross-bar switch 240 may thus include fifty-six write multiplexers 305. For illustration clarity, FIG. 3 shows only a single write multiplexer 305. Since there are forty master switch boxes 220 to choose from, each write multiplexer 305 is a 40:1 multiplexer. Each master switch box 220 drives its own set of write wires in a write bus 370. In an embodiment in which the memory width is 32 bits, each master switch box 220 drives thirty-two write wires in write bus 370. In one embodiment, write multiplexers 305 form a first means for selecting words from master switch boxes 220 as received over write bus 370 coupled to write paths 375 for master switch boxes 220 and also for driving the selected words into buffers 215. Similarly, read multiplexers 310 form a second means for selecting retrieved words over read bus 315 from buffers 215 and for driving the selected words to master switch boxes 220.

Analogous to read bus 315, write bus 370 may be arranged in the columnar footprint for crossbar switch 240 between master switch boxes 220 and buffers 215. Referring back to FIG. 2, the transistors necessary to form read multiplexers 310 and write multiplexers 305 may be integrated into the semiconductor substrate (not illustrated) supporting crossbar switch 240. Cross-bar switch 240 is thus represented in RICA 200 by its columnar footprint on the semiconductor substrate. This footprint would also contain any necessary repeaters to boost the signal values on read bus 315 and write bus 370. The read and write busses would be arranged in metal layers above the columnar footprint for cross-bar switch 240. It will be appreciated that RICA 200 is just an example embodiment. Thus, if there are a plurality M of master switch boxes 220 and a plurality N of buffers 215 (N and M being arbitrary integers of 2 or greater), cross-bar switch 240 would include N M:1 write multiplexers 305 and M N:1 read multiplexers 310. RICA 200 includes forty master switch boxes 220 and fifty-six buffers 215 so cross-bar switch 240 includes fifty-six 40:1 write multiplexers 305 and forty 56:1 read multiplexers 310.

As discussed earlier, the number of read wires in read bus 315 depends upon the width and number of buffers 215. If there are N buffers each of width Y (Y being an arbitrary plural integer), a resulting read bus includes N*Y read wires. In RICA 150, the buffer word width is 32 bits so there are 1,792 read wires in read bus 315. Similarly, if there are M master switch boxes, a resulting write bus includes M*Y write wires, where Y represents the word width for buffers 215. In RICA 200, the buffer word width is 32 bits so there are 1,280 write wires in write bus 370.

A memory built-in-test (MBIST) engine 150 advantageously exploits cross-bar switch 240 as discussed further herein so that buffers 215 may be tested in a time efficient manner and with high density. To do so, MBIST engine 150 broadcasts to all buffers 215 using the write path of at least one master switch box, which is designated as a BIST master switch box 220 to distinguish it from the otherwise identical remaining master switch boxes 220. During normal operation, a 2:1 multiplexer 320 in an output or write path 375 of BIST master switch box 220 selects for the BIST master switch box's data output word. In this fashion, BIST master switch box 220 may write to a desired buffer 215 during normal operation as discussed with regard to the remaining master switch boxes 220. But during testing, MBIST engine 150 commands 2:1 multiplexer 320 through a control signal 385 to select for a test word or vector 325 also provided by MBIST engine 150. The write path of BIST master switch box 220 is thus "hijacked" by MBIST engine 150 during the testing of buffers 215. This is quite advantageous in that the cross-bar switch 240 can then serve a role in the testing of buffers 215 rather than MBIST engine 150 having to use additional dedicated test hardware for the buffer testing. Test word 325 is received by all fifty-six write multiplexers 305, which are all controlled by MBIST engine 150 through control signals 380 to select for write path 375 of BIST master switch box 220. In this fashion, test word 325 is broadcast to all buffers 215 by exploiting cross-bar switch 240, which increases density and decreases testing time. In contrast to write multiplexers 305, there need be only one 2:1 multiplexer 320 in an embodiment with only one BIST master switch box 220.

After the desired number of test words are written into buffers 215, a design-for-test (DFT) element such as MBIST engine 150 needs an ability to retrieve the stored test words to check for errors in buffers 215. To do so, cross-bar switch 240 is again exploited in that MBIST engine 150 need merely tap into read bus 315 to receive the retrieved test words. MBIST engine 150 includes logic gates such as an XOR gate 360 so that the retrieved test words from buffers 215 may be compared to the originally-written test words 325 to identify any buffer hardware errors. To distinguish between the retrieved test words as compared to what was written into buffers 215, test words 325 driven into 2:1 multiplexer 320 by MBIST engine 150 are denoted herein as "driven" test words 325 as compared to the retrieved test words received by MBIST engine 150 over read bus 315.

Note that a certain amount of pipelining may be necessary in that both read bus 315 and write bus 370 and also write multiplexers 305 and read multiplexers 310 have appreciable RC delay. Moreover, any necessary repeaters (not illustrated) in the read and write paths also add to the pipelining delay. A first read register 335, a second read register 340, a first write register 345, and a second write register 350 accommodate this delay. For example, MBIST engine 150 may control 2:1 multiplexer 320 such that a test word 325 is written into first write register 345, which is between an input to write bus 370 and an output for 2:1 multiplexer 320. In a subsequent clock cycle, this registered test word may propagate through write multiplexers 305 to be registered in second write register 350, which is located between buffers 215 and cross-bar switch 240. Upon this second registration in write register 350, the test word is then available to buffers 315 for storage as received on a data input (din) port for each buffer 215. The registration for the read operation is analogous in that a retrieved test word is initially registered in first read register 335 from a data output (dout) port for each buffer 215 and then registered again in second read register 340 in a subsequent clock cycle, whereupon it is available to MBIST engine 150. An example RICA buffer testing method will now be discussed.

Example Method of Operation

Figure 4:
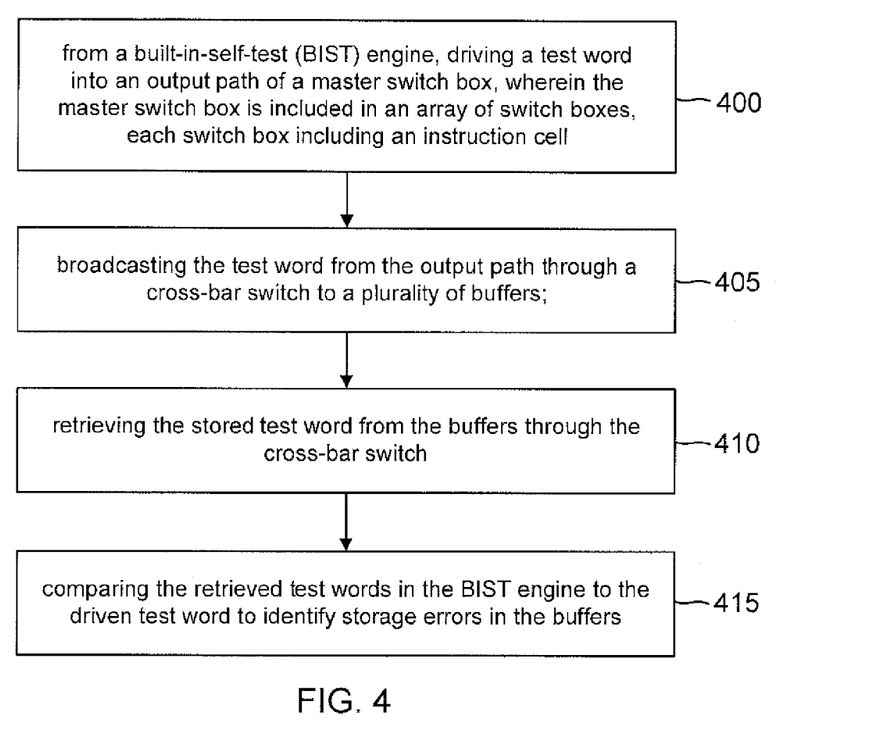
FIG. 4 is a flowchart for an example method of buffer testing in accordance with an embodiment of the disclosure.

A flowchart for an example RICA buffer testing method using the cross-bar embodiments disclosed herein is shown in FIG. 4. The method begins with an act 400 of, from a memory built-in-self-test (MBIST) engine, driving a test word into an output path of a master switch box, wherein the master switch box is included in an array of switch boxes, each switch box including an instruction cell. The method continues with an act 405 of broadcasting the test word from the output path through a cross-bar switch to a plurality of buffers. In addition, the method includes an act 410 of retrieving the stored test word from the buffers through the cross-bar switch. Finally, the method includes an act 415 of comparing the retrieved test words to the driven test word to identify storage errors in the buffers.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A reconfigurable instruction cell array (RICA), comprising:
 a plurality of master switch boxes;
 a plurality of buffers configured to store words from the master switch boxes;
 a cross-bar switch including:
  a write bus configured to carry the words from the plurality of master switch boxes;
  a plurality of write multiplexers corresponding on a one-to-one basis with the plurality of buffers, each write multiplexer being configured to select a word to be written to the corresponding buffer from the write bus,
  a read bus coupled to the buffers and configured to receive retrieved words from the buffers, and
  a plurality of read multiplexers corresponding on a one-to-one basis with the plurality of master switch boxes, each read multiplexer being configured to select from the retrieved words received on the read bus and to drive the selected retrieved word to the corresponding master switch box;
 a memory built-in-self-test (MBIST) engine configured to selectively drive a write path for a BIST one of the master switch boxes during a test mode with a test word for broadcasting through the write multiplexers into each of the buffers, the MBIST engine being further configured to retrieve stored test words from the buffers through the read bus and to compare the driven test word to the retrieved test words to identify storage errors in the buffers.

2. The RICA of claim 1, further comprising an array of non-master switch boxes, wherein each non-master switch box includes a switching fabric for the routing of words to adjacent non-master switch boxes in the array or to master switch boxes such that each non-master switch box is configured to read words from and write words to the buffers through at least one master switch box and the cross-bar switch.

3. The RICA of claim 2, wherein each master switch box and non-master switch box includes an instruction cell.

4. The RICA of claim 2, wherein the master switch boxes and non-master switch boxes are arranged into rows and columns into an array footprint on a semiconductor substrate and the buffers are also arranged into rows and columns into a buffer footprint adjacent the array footprint, and wherein the cross-bar switch occupies a columnar footprint on the semiconductor substrate between the array footprint and the buffer footprint.

5. The RICA of claim 4, wherein the read bus occupies one or more metal layers adjacent the columnar footprint for the cross-bar switch.

6. The RICA of claim 1, wherein the plurality of write multiplexers corresponds to the plurality of buffers such that each buffer couples to an output from a corresponding write multiplexer.

7. The RICA of claim 1, wherein the plurality of read multiplexers corresponds to the plurality of master switch boxes such that each master switch box couples to in input of a corresponding read multiplexer.

8. The RICA of claim 1, wherein the MBIST engine includes an XOR gate for comparing the driven test word to the retrieved test words to identify storage errors in the buffers.

9. The RICA of claim 1, further comprising a first write register coupled to a write path for each master switch box between the cross-bar switch and the write multiplexers.

10. The RICA of claim 9, further comprising a second write register coupled between the buffers and the write multiplexers.

11. The RICA of claim 1, further comprising a first read register and a second read register, wherein the first read register is coupled between the read bus and the buffers and wherein the second read register is coupled between the read bus and the MBIST engine.

12. A method of testing buffers in a reconfigurable instruction cell array (RICA), comprising
 for a plurality of master switch boxes coupled to an array of buffers through a cross-bar switch including a write bus and a plurality of write multiplexers corresponding on a one-to-one basis with the plurality of buffers, transmitting a word from one of the master switch boxes onto the write bus to a selected one of the buffers;
 for the selected one of the buffers; selecting for the word transmitted on the write bus through the corresponding write multiplexer and storing the selected word in the selected one of the buffers;
 from a memory built-in-self-test (MBIST) engine, driving a test word into an output path of a BIST one of the master switch boxes to the write bus;
 in each write multiplexer, selecting for the test word so that each buffer stores the test word;
 retrieving the stored test words from the buffers through the cross-bar switch; and
 comparing the retrieved test words to the driven test word to identify storage errors in the buffers.

13. The method of claim 12, wherein retrieving the stored test words comprises receiving the retrieved test words at the MBIST engine over a read bus in the cross-bar switch.

14. The method of claim 12, wherein comparing the received test words to the driven test word comprises exclusive ORing the retrieved test words with the driven test word.

15. The method of claim 12, wherein driving the test word into the output path of the BIST master switch box comprises controlling a 2:1 multiplexer to select for the test word instead of selecting for a data output word from the BIST master switch box.

16. The method of claim 12, further comprising routing a word from a switch box in an array of switch boxes to the master switch box; and routing the word from the master switch box through the cross-bar switch to a selected one of the buffers.

* * * * *